United States Patent [19]

Mariani

[11] Patent Number: 4,801,836
[45] Date of Patent: Jan. 31, 1989

[54] SAW DISPERSIVE DELAY DEVICE

[75] Inventor: Elio A. Mariani, Hamilton Square, N.J.

[73] Assignee: The United States of America as represented by the Secretary of the Army, Washington, D.C.

[21] Appl. No.: 128,700

[22] Filed: Aug. 24, 1987

[51] Int. Cl.$^4$ .............................................. H01L 41/08
[52] U.S. Cl. ................................. 310/313 D; 333/154
[58] Field of Search ........... 310/313 R, 313 A, 313 C, 310/313 D; 333/151, 153, 154, 194, 195

[56] References Cited

U.S. PATENT DOCUMENTS

| | | | |
|---|---|---|---|
| 3,883,831 | 5/1975 | Williamson et al. | 310/313 D X |
| 4,155,057 | 5/1979 | Sandy et al. | 310/313 D |
| 4,166,228 | 8/1979 | Solie | 310/313 D |
| 4,403,165 | 9/1983 | Ballato et al. | 310/313 D |
| 4,551,695 | 11/1985 | Tanji et al. | 310/313 D X |

OTHER PUBLICATIONS

New Types of SAW Reflectors and Resonators Consisting of Reflecting Elements with Positive and Negative Reflection Coefficients by Masao Takeuchi et al., IEEE Transactions on Ultrasonics, Ferroelectrics and Frequency Control, vol. UFFC-33, No. 4, Jul. 1986, pp. 396-374.
"L-Band Reflective-Array Compressor with a Compression Ratio of 5120" by Williamson et al., MIT London Laboratory, pp. 490-493.

Primary Examiner—Mark O. Budd
Attorney, Agent, or Firm—Sheldon Kanars; John K. Mullarney

[57] ABSTRACT

A SAW dispersive delay device comprises a high-coupling piezoelectric substrate such as lithium niobate, an input and an output metallic transducer deposited on the piezoelectric substrate, and a pair of coextensive metallic reflective arrays deposited on the same substrate and respectively aligned with the transducers. The arrays comprise a number of "shorted" and "open" reflectors which are alternately interleaved. The reflectors are inclined substantially 45° with respect to the aligned tranducer propagation direction. The periodicity of the reflectors varies along the length of each reflective array so that different frequencies are reflected at different locations along each array to thereby provide a different delay path. The periodicity variation is the same in the two arrays. The periodicity of these reflectors varys in a manner consistent with a prescribed dispersion characteristic.

1 Claim, 1 Drawing Sheet

SAW DISPERSIVE DELAY DEVICE

The invention described herein may be manufactured, used, and licensed by or for the Government for governmental purposes without the payment to me of any royalties thereon.

TECHNICAL FIELD

The present invention relates generally to surface acoustic wave (SAW) dispersive delay line technology and, more particularly, to a SAW reflective array correlator (RAC) using metallic reflectors with positive and negative reflection coefficients.

BACKGROUND OF THE INVENTION

SAW RAC devices (i.e., dispersive delay lines) have important uses in pulse compression radars, Fourier transform signal processing, etc. Other device configurations have been proposed over the years for achieving the requisite dispersion characteristics, whereby electromagnetic wave and ultrasonic delay lines were used to provide a given dispersive delay (i.e., a delay that is a desired function of frequency). More recently, SAW dispersive devices comprising ion-milled grating reflectors have been widely used. Unfortunately, the ion-milling of the grove reflectors requires an extra operation which is rather costly and time consuming. Moreover, ion-milled reflection SAW devices suffer from high insertion loss which, of course, affects efficiency. If the ion-milled grating reflector grooves are made deeper in an effort to make the gratings more effective in order to reduce insertion loss, the device then suffers from bulk-mode conversion that contributes to additional insertion loss and spurious responses.

A new reflector concept for SAW resonators was set forth in the article "New Types of SAW Reflectors and Resonators Consisting of Reflecting Elements With Positive and Negative Coefficients" by M. Takeuchi et al, IEEE Transactions on Untrasonics, Ferroelectrics, and Frequency Control, Vol. UFFC-33, No. 4, July 1986, pp. 369–374. The described resonator reflector has the advantages of large reflectivity, wide stopband, and small mode conversion into bulk waves.

SUMMARY OF THE INVENTION

It is the primary object of the present invention to achieve a more efficient, cost-effective, SAW dispersive delay device which results in a low cost, lower insertion loss, dispersive delay line capable of wideband operation.

Still another object of the invention is to provide a SAW reflective array correlator (RAC) using monolithic metallic reflectors with positive and negative reflection coefficients.

The above and other objects are achieved in accordance with the invention wherein an input and an output transducer are defined on a piezoelectric substrate (e.g., lithium niobate) along with a pair of reflective arrays that are respectively aligned on the substrate with the transducers. Each reflective array comprises a multiplicity of "shorted" and "open" metallic reflectors which are alternatively interleaved. Both arrays are inclined at substantially forty-five degrees (±45°) with respect to the propagation direction of the transducer aligned therewith. The periodicity of the reflectors varies along the length of each reflector array so that different frequencies are reflected at different locations along each array to thereby provide a different delay path. The periodicity variation is the same along the length of the two arrays.

In operation, a pulse signal, for example, will be propagated in the SAW device from the input transducer to the reflective array aligned therewith where it will be reflected 90° toward the other array. This other array reflects the signal another 90° toward the output transducer. Because the periodicity of the reflectors of the two arrays varies along the length therefore different frequencies that make up the pulse signal traverse different path lengths and, as a consequence, the pulse signal is expanded or dispersed (or alternatively collapsed).

BRIEF DESCRIPTION OF THE DRAWINGS

The invention will be more fully appreciated from the following detailed description when the same is considered in connection with the accompanying drawings, in which.

DETAILED DESCRIPTION

Figure 1:
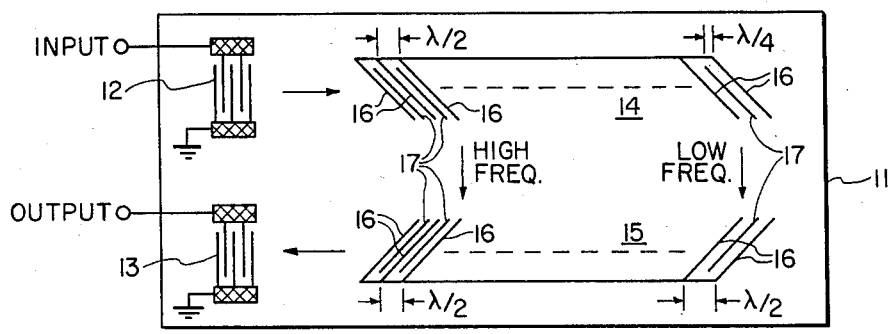
FIG. 1 illustrates a SAW reflective array correlator in accordance with the present invention.

Turning now to FIG. 1 of the drawings, there is shown a SAW reflective array correlator comprising a piezoelectric substrate 11 and a pair of conventional periodic interdigital transducers 12 & 13 for signal input/output purposes. In the preferred embodiment, a SAW substrate of lithium niobate (128° Y—X LiNbO$_3$) is desirable. This is a high coupling material quite suitable for wideband operation. The invention, however, should in no way be construed as limited to this substrate and other known substrate materials (e.g., LiTaO$_3$) may be utilized in practicing the principles of the present invention. The input and output transducers, as well as the reflective arrays to be described, are photo-etched in thin-film metal (i.e., aluminum) to produce a rugged monolithic device. The device of the invention allows for complete photolithographic fabrication thereby eliminating the need for the costly and time consuming ion-milling of groove reflectors as in current practice for wideband SAW RAC devices. The photolithography process is itself a well-known method of fabrication.

A pair of coextensive reflective arrays 14 and 15 are respectively aligned with the input/output transducers 12 and 13. Each reflective array comprises a number of "shorted" metallic reflectors 16 and a number of "open" metallic reflectors 17, with the open and shorted reflectors alternately interleaved. Both arrays are inclined at substantially ±45° with respect to the propagation direction of the transducer aligned therewith; that is, ±45° with respect to the X-axis for 128° Y-X LiNbO$_3$. Accordingly, as evident from FIG. 1, the reflective arrays serve to reflect the propagated surface acoustic wave (SAW) through 90°, twice. The periodicity of the reflectors varies along the length of each reflector array so that different frequencies are reflected at different locations along each array thus providing a different delay path. The periodicity variation is the same in the two arrays. The RAC shown in FIG. 1 is therefore a dispersive delay device since the time delay experienced by an input signal will be a (linear or non-linear) function of frequency.

As will be apparent to those skilled in the art, the periodicity variation of the reflectors will be a function of the frequency range or bandwidth of the signal to be propagated in the SAW device. As indicated in FIG. 1, the spacing of the shorted reflectors 16 is equal to $\lambda/2$ and is therefore less for the shorter wavelength (high frequency) signal components and, conversely, the spacing (also $\lambda/2$) is greater for the longer wavelength (lower frequency) signal components. The interspersed, open reflectors 17 lie midway between each pair of adjacent shorted reflectors; the distance from the center of an open reflector to the center of a shorted reflector is $\lambda/4$. The length of the reflector elements should be substantially coextensive with the acoustic aperture of the input/output transducers.

The RAC device shown in FIG. 1 is, of course, a dispersive one and an input pulse type signal will be expanded or "stretched." To provide a "collapse" or compression device (for an expanded signal) it is merely necessary to reverse the periodicity variation of the arrays 14 and 15. This should be obvious.

The SAW dispersive delay device shown in FIG. 1 operates in the following manner. A pulse type signal, for example, delivered to the input transducer 12 will be propagated in the SAW device toward the reflective array 14 where it will be reflected 90° toward the array 15. As indicated in the figure, the higher frequency components of the signal will be reflected by those reflectors at the front of the array 14, with the lower frequency components reflected by the reflectors at the back or rear of the array. The reflective array 15 reflects the pulse signal components another 90° toward the output transducer 13. Accordingly, it will be apparent that the different frequency components that make up the pulse type signal traverse different path lengths and, as a consequence, the pulse is dispersed or expanded (i.e. the delay time of the device varies with frequency).

The RAC device of the invention makes use of reflecting elements with positive and negative reflectivity where each reflector element is nominally spaced by $\lambda/4$, with $\lambda$ being the localized frequency (SAW) wavelength. These positive/negative (PNR) reflectors have twice the reflectivity per wavelength as compared to prior art reflectors, with small mode-conversion loss into bulk waves and wide stopband width. The reflector arrays consist of reflecting elements with alternating positive and negative signs of reflection coefficient ($\nu_o$); see FIG. 2. The reflected waves from these reflecting arrays are in-phase, since the reflection phase from the open and shorted strips though initially out-of-phase are brought back into phase due to the $\lambda/4$ spacing between the same.

Although the reflection coefficient of any reflector is small, at any one frequency the reflected waves add coherently and produce a much larger reflected wave amplitude. As indicated heretofore, the "local" periodicity corresponds to $\lambda/2$ between shorted reflectors and $\lambda/4$ between open and shorted reflectors, where $\lambda$ corresponds to the SAW wavelength for the frequency associated with that part of the reflective array.

Figure 2:
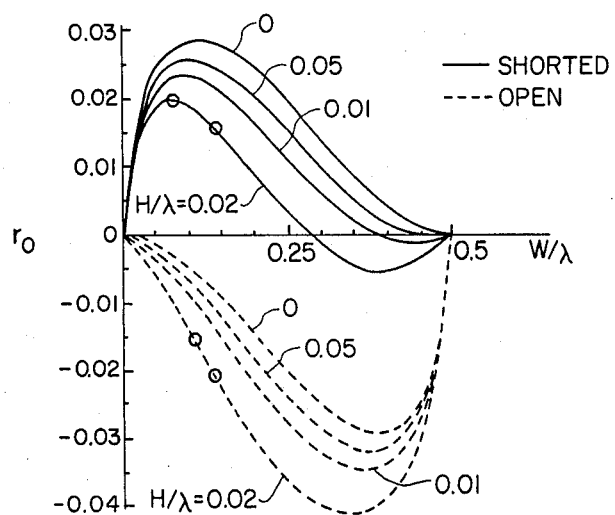
FIG. 2 shows the reflection characteristics and is useful in the design of the reflector array geometry.

FIG. 2 shows the reflection characteristics for thin-film aluminum strip(s) of various thickness on 128° Y-X LiNbO$_3$, where W/$\lambda$: Normalized strip width, and H/$\lambda$: Normalized strip thickness. The sign of the reflection coefficient ($\nu_o$) arising from electrical loading only (H=$\phi$) is positive for a shorted strip and negative for an open strip.

Using the curves of FIG. 2, two examples of the reflector array geometry will be given for localized regions of the reflector arrays. In the first example (I), if we assume $\nu_o$=0.02, and H/$\lambda$=0.02, then W/$\lambda$=0.075 (from FIG. 2). H is the thickness of the Al film, $\lambda$ is the localized (SAW) wavelength, and W is (shorted) reflector width (see FIG. 3). For the open reflector when $\nu_o$=−0.02 and H/$\lambda$=0.02, then W/$\lambda$=0.15 (from FIG. 2). To tabulate the above:

| Short | | Open | |
|---|---|---|---|
| H/$\lambda$ = 0.02 } for | | H/$\lambda$ = 0.02 } for | |
| W/$\lambda$ = 0.075 } $\nu_0$ = 0.02 | | W/$\lambda$ = 0.15 } $\nu_0$ = −.02 | |

Then, for an assumed (SAW) frequency f=350 MHz, $\lambda \approx 10\mu$, and H=0.02·(10$\mu$)=0.2$\mu$=2000 Å. $W_{short}$=0.075·(10$\mu$)=0.75$\mu$; $W_{open}$=0.15·(10$\mu$)=1.5$\mu$; $\lambda/4$=2.5$\mu$; and D (reflector separation)=2.5$\mu$−(0.375+0.75)$\mu$=1.375$\mu$.

To tabulate the second (II) example:

| Short | | Open | |
|---|---|---|---|
| H/$\lambda$ = 0.02 } for | | H/$\lambda$ = 0.02 } for | |
| W/$\lambda$ = 0.15 } $\nu_0$ = 0.015 | | W/$\lambda$ = 0.12 } $\nu_0$ = −0.015 | |

Then if f=350 MHz (as before), $\lambda \approx 10\mu$, H=2000Å, and $\lambda/4$=2.5$\mu$. $W_{short}$=0.15·(10$\mu$)=1.5$\mu$; $W_{open}$=0.12·(10$\mu$)=1.2$\mu$; and D=2.5$\mu$−1.35$\mu$=1.15$\mu$.

The above calculated values for W and D for the two examples are tabulated below:

| | $W_{short}$ | $W_{open}$ | D |
|---|---|---|---|
| I | 0.75$\mu$ | 1.5$\mu$ | 1.375$\mu$ |
| II | 1.5$\mu$ | 1.2$\mu$ | 1.15$\mu$ |

Figure 3:
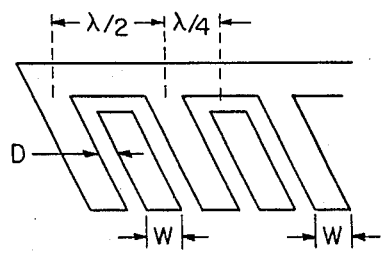
FIG. 3 shows an enlarged local section of a reflective array.

For illustrative simplicity, the short and open reflectors are shown in FIG. 3 as being of equal width W. However, as indicated in the above table, the reflector widths will, in fact, differ. The Al film thickness (H) is typically a constant and therefore for a desired reflection coefficient ($\nu_o$) the widths (W) and separation (D) of the reflector elements can be calculated over the (SAW) bandwidth of interest. The periodicity and hence the values of W and D will, of course, change along the length of the reflector array so that different frequencies are reflected at different locations along each array. The reflector array parameters can be laboriously calculated in the above-described manner. However, since the dispersion characteristic will typically be linear, the values for W and D will also change linearly. Accordingly, given the value for film thickness (H), the desired reflection characteristics and coefficient ($\nu_o$), and the SAW bandwidth of interest, a computer can be readily programmed to provide the requisite reflector parameters. The operations involved are simple arithmetic ones, and the programming of the same is straightforward.

In the prior (RAC) art reflector arrangements, increasing the SAW reflector reflectivity typically resulted in excess bulk-mode conversion loss. The described RAC device utilizing the PNR configuration has lower bulk wave mode conversion, while achieving higher grating reflectivity and a corresponding lower insertion loss.

The above-described RAC device using the PNR configuration allows for the amplitude weighting (apodizing) of the device response. Weighting can be achieved by varying the length of the metal strip reflectors and/or by changing the position(s) of the open and short reflector strip(s) or even by the selective removal of specific reflectors.

Accordingly, while a particular embodiment of the invention has been described in detail herein, it is to be understood that numerous other embodiments may be devised by those skilled in the art without departing from the spirit and scope of the invention.

What is claimed is:

1. A SAW reflective array correlator utilizing metallic reflectors with positive and negative reflection coefficients comprising a substrate of 128° Y-X LiNbO$_3$, an input and output periodic interdigital transducer on said substrate, a pair of coextensive reflective arrays on said substrate and aligned respectively with said transducers, said transducers and said arrays being of thin-film aluminum photo-etched on said substrate, said reflective arrays having a multiplicity of shorted reflectors and a multiplicity of open reflectors that are alternately interleaved with the shorted reflectors, the reflectors of each reflective array being inclined substantially 45° with respect to the transducer propagation direction and the x-axis of the 128° Y-X LiNbO$_3$ substrate, the periodicity of the reflectors varying along the length of each reflective array so that different frequencies are reflected at different locations along each array to thereby provide a different delay path, the periodicity variation being the same in the two arrays, the width of the shorted and open reflectors and the separation between the reflectors decreasing in a predetermined linear manner along the length of each reflective array for increasing frequencies to be reflected by the array, the spacing between said shorted reflectors being equal to $\lambda/2$ and between adjacent open and shorted reflectors being equal to $\lambda/4$ where $\lambda$ corresponds to the SAW wavelength for the frequency associated with a given section of a reflective array, said shorted and open reflectors having a length that is substantially coextensive with the acoustic aperture of the input and output transducers.

* * * * *